(12) United States Patent
Kusakabe et al.

(10) Patent No.: US 6,472,324 B2
(45) Date of Patent: Oct. 29, 2002

(54) METHOD OF MANUFACTURING TRENCH TYPE ELEMENT ISOLATION STRUCTURE

(75) Inventors: Yoshihiko Kusakabe, Tokyo (JP); Yasuki Morino, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/809,184

(22) Filed: Mar. 16, 2001

(65) Prior Publication Data

US 2001/0034130 A1 Oct. 25, 2001

(30) Foreign Application Priority Data

Mar. 17, 2000 (JP) ........................................ 2000-075320
Nov. 13, 2000 (JP) ........................................ 2000-344865

(51) Int. Cl.$^7$ ............................................ H01L 21/302
(52) U.S. Cl. ........................ 438/692; 438/694; 438/695; 438/696; 438/697; 438/700
(58) Field of Search ................................. 438/692, 694, 438/695, 696, 697, 700, 756, 757

(56) References Cited

U.S. PATENT DOCUMENTS 4,104,086 A    8/1978   Bondur et al.
5,981,354 A * 11/1999   Spikes et al. ................ 438/424
6,090,683 A *   7/2000   Torek ........................... 438/424

* cited by examiner

Primary Examiner—Benjamin L. Utech
Assistant Examiner—Binh X. Tran
(74) Attorney, Agent, or Firm—Burns, Doane, Swecker & Mathis, LLP

(57) ABSTRACT

The present invention is directed to a method of manufacturing a trench type semiconductor element isolation structure including the steps of: (i) forming a silicon oxide film on a silicon substrate and forming a silicon nitride film on the silicon oxide film; (ii) forming a groove penetrating the silicon nitride film and the silicon oxide film, said groove reaching an interior of the silicon substrate; (iii) forming a thermal oxide film on an inner wall of said groove; (iv) depositing an oxide in said groove; (v) subjecting said oxide to a polishing treatment with the silicon nitride film used as a stopper layer, so that a part of the insulator is removed; (vi) etching the oxide by a predetermined amount of said oxide after completing the step (v); (vii) etching the silicon nitride film after completing the step (vi); and (viii) etching the silicon oxide film after completing the step (vii).

5 Claims, 12 Drawing Sheets

METHOD OF MANUFACTURING TRENCH TYPE ELEMENT ISOLATION STRUCTURE

BACKGROUND OF THE INVENTION

The present invention relates to a method of fabricating a semiconductor device having a trench type element isolation structure.

In a semiconductor integrated circuit, it is required to control each element so as to be completely isolated from each other by eliminating electric interference between the elements. An isolation method with local oxidation (LOCOS) has been conventionally used as a method of electrically isolating elements. However, when the local oxidation is used, the isolation region develops a unique shape like a bird's beak at its ends so as to expand the isolation region, which cause a problem of decreasing the active region of the elements. In a DRAM with an advanced microstructure, it is essential to have a shallow trench isolation (STI) structure where the elements are electrically isolated from each other by forming trenches in the substrate and burying insulators in the trenches so as to reduce the bird's beak region developed at the ends of the isolation region.

FIGS. 9(a) and 9(b) are cross sectional views of the process steps showing the method of fabricating a conventional typical trench type element isolation structure. First, at the process step 1 an underlying silicon oxide film 2 and a silicon nitride film 3 are accumulated in this order onto a silicon substrate 1. At the process step 2 a mask (not shown) is formed onto the silicon nitride film 3, and then the silicon nitride film 3 and the underlying silicon oxide film 2 are patterned in this order so as to form a trench 13 in the silicon substrate 1. At the process step 3 a thermal oxide film 10 is formed on the inner wall of the trench by thermal oxidation, and at the process step 4 an oxide 11 is deposited onto the entire surface by a CVD method. At the process step 5 the oxide 11 formed on the silicon nitride film 3 is removed by a CMP method (Chemical Mechanical Polishing) using the silicon nitride film 3 as a stopper so as to leave the oxide 11 only inside the trench 13. At the process step 6 the silicon nitride film 3 is removed by a heat phosphate solution, and at the process step 7 the underlying oxide film 2 is removed by fluoric acid so as to complete a trench type element isolation structure. The first case of such a trench isolation method is disclosed in U.S. Pat. No. 4,104,086.

As shown in FIG. 10, as an improved trench isolation with the above-mentioned conventional structure, Japanese Unexamined Patent Publication No. 340950/1998 shows the case where a polycrystalline silicon film 4 is arranged between the underlying silicon oxide film 2 and the silicon nitride film 3. In this case, in the thermal oxidation shown at the process step 3' the difference in oxidation rate between the silicon substrate 1 and the polycrystalline silicon film 4 makes it possible to expand the formation region of the thermal oxide film 12 towards the active region. This restricts the development of hollows when the element is completed (at process step 7).

In the method of fabricating a trench type element isolation structure, a level difference of −300 to 900 Å (hereinafter referred to as STI level difference) is caused between the oxide 11 for element isolation and the silicon substrate 1 as shown in FIGS. 11(a) and 11(b) due to variations in the thickness of the silicon nitride film 3, variations in the loss amount of the silicon nitride film 3 caused when the trench 13 is formed in the silicon substrate 1, variations in leveling process amount by the CMP method, and the like resulting from the process variations in the formation process. In the integrated circuit, as shown in FIG. 12, the electrode layer 23 deposited on the surface of the element is micro-etched to form a gate electrode on the isolation region $Z_1$, so as to control the transistor formed in the active region $Z_2$. When the STI level difference drops as shown in FIG. 11(b), the gate electrode is surrounded by the side wall of the active region, making the electric field be concentrated on the side wall so as to cause a decrease the threshold voltage of the transistor, which is referred to as reverse narrow channel effects. The reverse narrow channel effects increase as the semiconductor is integrated in larger densities and the widths of the active regions (intervals of the trenches) become narrower, making it very difficult to control the threshold voltage of the transistor. On the other hand, when the STI level difference becomes too large as shown in FIG. 11(a), it may cause inconveniences such as the development of etching residues in the level difference portions at the ends of the isolation region when the gate electrode is micro-etched. In order to avoid such inconveniences, it is preferable that the STI level difference is between 0 and 600 Å.

The present invention has been contrived to solve the above-mentioned problems, with an object of providing a method of fabricating a trench type element isolation structure whose element suffers from little property deterioration by preventing a drop in the STI level difference of the trench type element isolation structure, and by controlling the height of the STI level difference at a proper level, so as to improve the yield and reliability of the element.

SUMMARY OF THE INVENTION

The first aspect of the present invention is a method of manufacturing a trench type semiconductor element isolation structure comprising steps of:

(i) forming a silicon oxide film on a silicon substrate and forming a silicon nitride film on the silicon oxide film;

(ii) forming a trench penetrating the silicon nitride film and the silicon oxide film, said trench reaching an interior of the silicon substrate;

(iii) forming a thermal silicon oxide film on an inner wall of said trench;

(iv) depositing a silicon oxide in said trench;

(v) subjecting said silicon oxide to a polishing treatment with the silicon nitride film used as a stopper layer leaving said silicon oxide only in the trench;

(vi) etching the silicon oxide by a predetermined amount according to at least one of the thickness of the silicon nitride film after the steps (i), (ii) and (v) and heights of the silicon oxide after the steps (iv) and (v);

(vii) etching the silicon nitride film after completing the step (vi); and (viii) etching the silicon oxide film after completing the step (vii).

The silicon oxide is etched by in the step (vi) the predetermined amount according to a value based on a sum of a thickness of the silicon nitride film after the step (ii) and a height of the silicon oxide after the step (v) subtracted by a height of the silicon oxide after the step (iv).

The silicon oxide is etched in the step (vi) by the predetermined amount on the basis of a thickness of the silicon nitride film after the step (ii) and a second height of the silicon oxide after the step (v).

The second aspect of the present invention is a method of manufacturing a trench type semiconductor element isolation structure comprising steps of:

(i) forming a silicon oxide film on a silicon substrate and forming a silicon nitride film on the silicon oxide film;

(ii) forming a trench penetrating the silicon nitride film and the silicon oxide film, said trench reaching an interior of the silicon substrate;

(iii) forming a thermal silicon oxide film on an inner wall of said trench;

(iv) depositing a silicon oxide in said trench;

(v) subjecting said silicon oxide to a polishing treatment with the silicon nitride film used as a stopper layer leaving said silicon oxide only in the trench;

(vi) etching said silicon oxide by a predetermined amount after completing the step (v);

(vii) etching said silicon nitride film after completing the step (vi); and (viii) etching said silicon oxide film and said silicon oxide based on an amount of dissolved silicon in an etchant in the step (vii).

The third aspect of the present invention is a method of manufacturing a trench type semiconductor element isolation structure comprising steps of:

(i) forming a silicon oxide film on a silicon substrate and forming a silicon nitride film on the silicon oxide film;

(ii) forming a trench penetrating the silicon nitride film and the silicon oxide film, said trench reaching an interior of the silicon substrate;

(iii) forming a thermal silicon oxide film on an inner wall of said trench;

(iv) depositing a silicon oxide in said trench;

(v) subjecting said silicon oxide to a polishing treatment with the silicon nitride film used as a stopper layer leaving said silicon oxide only in the trench;

(vi) etching said silicon nitride film after completing the step (v); and (vii) etching said silicon oxide film and said silicon oxide by predetermined amount based on a measured value of a difference in surface level between said silicon oxide film and said silicon oxide.

The fourth aspect of the present invention is a method of manufacturing a trench type semiconductor element isolation structure comprising steps of:

(i) forming a silicon oxide film on a silicon substrate, forming a polycrystalline silicon film on said silicon oxide film, and forming a silicon nitride film on said polycrystalline film;

(ii) forming a trench by which said silicon nitride film, said polycrystalline silicon film and said silicon oxide film are penetrated, said trench reaching within said silicon substrate;

(iii) forming a thermal silicon oxide film on an inner wall of said trench;

(iv) depositing a silicon oxide in said trench;

(v) removing a part of said silicon oxide by a polishing process using silicon nitride film as a stopper layer leaving said silicon oxide only in said trench;

(vi) etching said silicon oxide by a predetermined amount after completing the step (v) based on at least one of measured values of a first thickness of said silicon nitride film formed in the step (i), a second thickness of said silicon nitride film after completing the step (ii), a first height of said silicon oxide deposited in said trench in the step (iv), a third thickness of said silicon nitride film after completing the step (v) and a second height of said silicon oxide after completing the step (v);

(vii) etching said silicon nitride film and said polycrystalline silicone film after completing the step (vi); and (viii) etching said silicon oxide film after completing the step (vii).

The silicon oxide is etched by the predetermined amount on the basis of a value obtained by subtracting the first height of the silicon oxide from a sum of the second height of the silicon oxide and the second thickness of said silicon nitride film.

The silicon oxide is etched in the step (vi) by the predetermined amount on the basis of the second thickness of the silicon nitride film and the second height of the silicon oxide.

The fifth aspect of the present invention is a manufacturing a trench type semiconductor element isolation structure comprising steps of:

(i) forming a silicon oxide film on a silicon substrate, forming a polycrystalline silicon film on said silicon oxide film, and forming a silicon nitride film on said polycrystalline film;

(ii) forming a trench by which said silicon nitride film, said polycrystalline silicon film and said silicon oxide film are penetrated, said trench reaching within said silicon substrate;

(iii) forming a thermal silicon oxide film on an inner wall of said trench;

(iv) depositing a silicon oxide in said trench;

(v) removing a part of said silicon oxide by a polishing process using silicon nitride film as a stopper layer leaving said silicon oxide only in said trench;

(vi) etching said silicon oxide by a predetermined amount after completing the step (v);

(vii) etching said silicon nitride film, and then etching said polycrystalline film after completing the step (vi); and (viii) etching said silicon oxide film and said silicon oxide by a predetermined amount based on amount of silicon dissolved in an etchant of said silicon nitride film in the step (vii).

The sixth aspect of the present invention is a method of manufacturing a trench type semiconductor element isolation structure comprising steps of:

(i) forming a silicon oxide film on a silicon substrate, forming a polycrystalline silicon film on said silicon oxide film, and forming a silicon nitride film on said polycrystalline film;

(ii) forming a trench by which said silicon nitride film, said polycrystalline silicon film and said silicon oxide film are penetrated, said trench reaching within said silicon substrate;

(iii) forming a thermal silicon oxide film on an inner wall of said trench;

(iv) depositing a silicon oxide in said trench;

(v) removing a part of said silicon oxide by a polishing process using silicon nitride film as a stopper layer leaving said silicon oxide only in said trench;

(vi) etching said silicon nitride film, and then etching said polycrystalline silicon film after completing the step (v);

(vii) etching said silicon oxide film and said silicon oxide by predetermined amount either a measured value of a difference in surface level between said polycrystalline silicon film and said silicon oxide which are formed by etching said silicon nitride film, or a measured value of a difference in surface level between said silicon oxide film and said silicon oxide which are formed by etching said polycrystalline silicon film.

DETAILED DESCRIPTION

Figure 1:
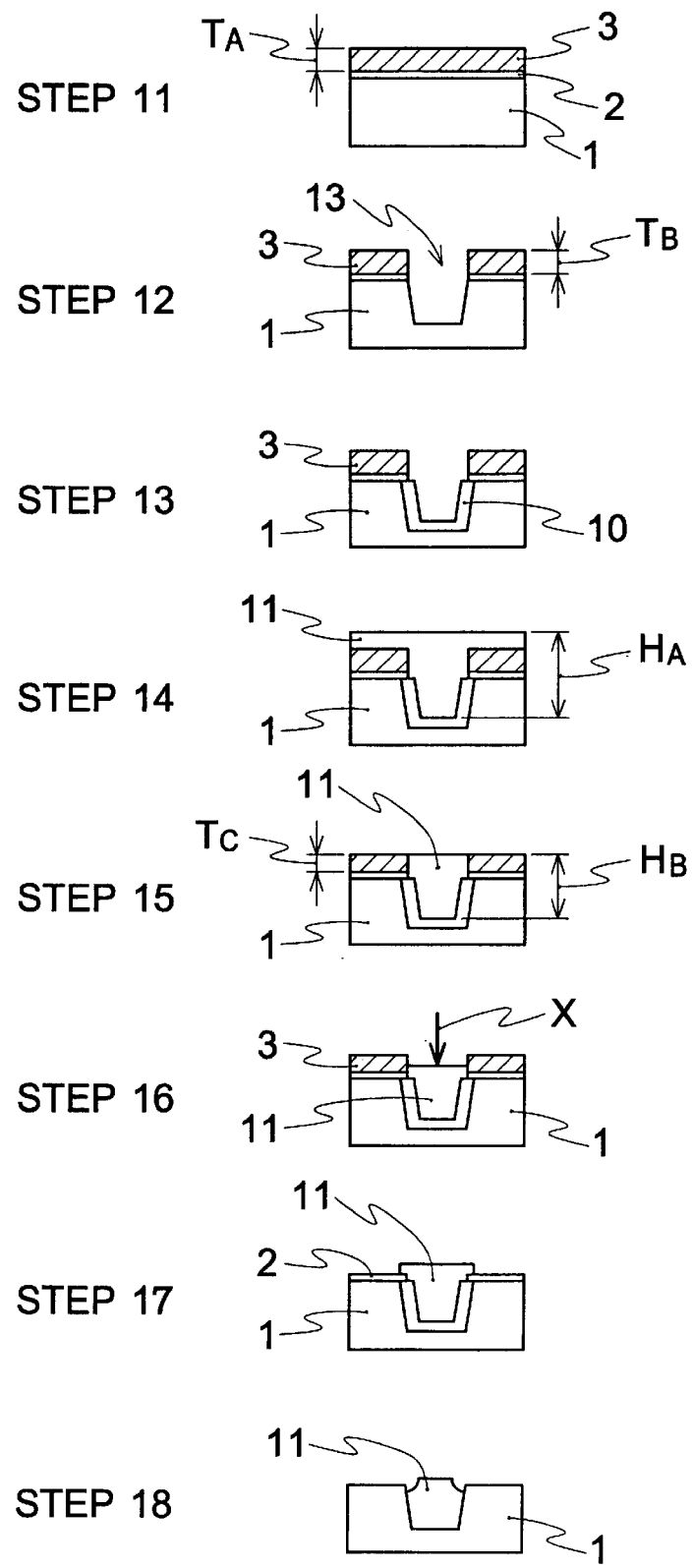
FIG. 1 is a cross-sectional view showing a method of manufacturing a trench type element isolation structure in Embodiment 1.

An embodiment of the present invention will be described as follows based on the drawings. Like components are labeled with like reference numerals with respect the prior art, and the description of these components is not repeated.

Embodiment 1

Figure 9:
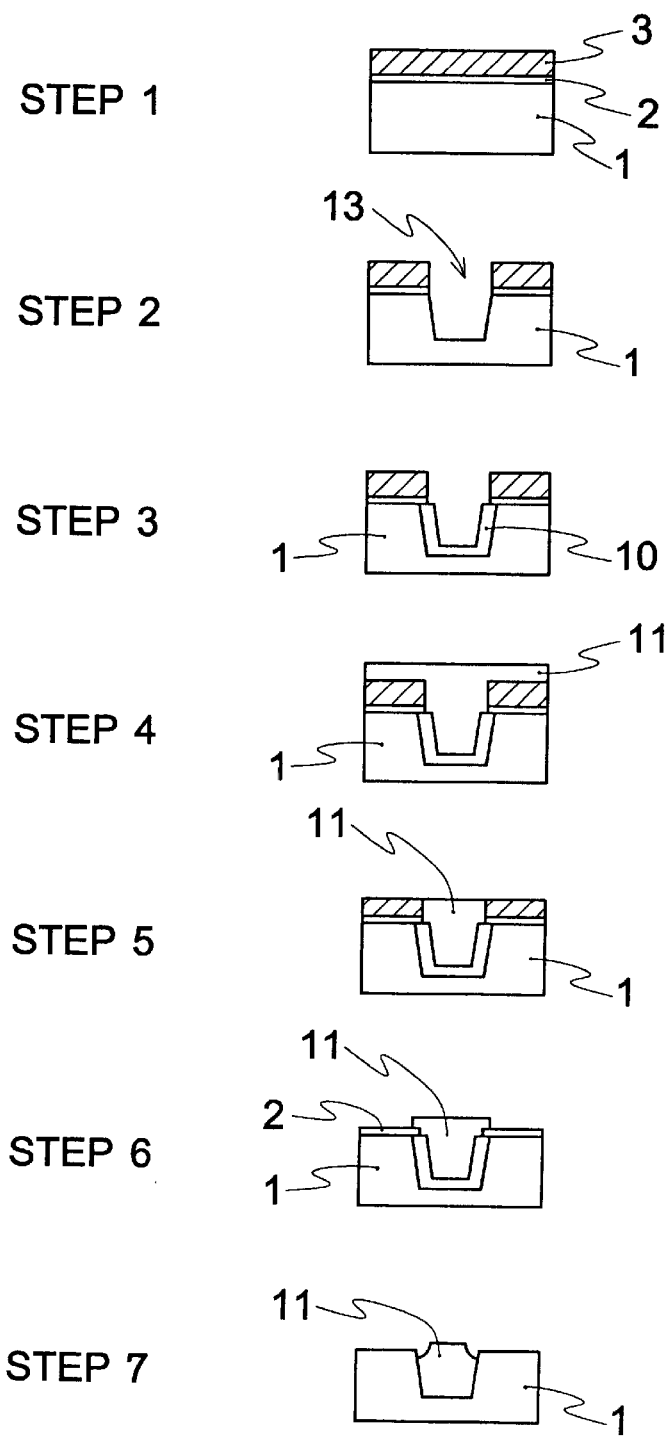
FIG. 9 is a cross-sectional view of manufacturing steps showing a method of manufacturing a conventional trench type element isolation structure.
Figure 10:
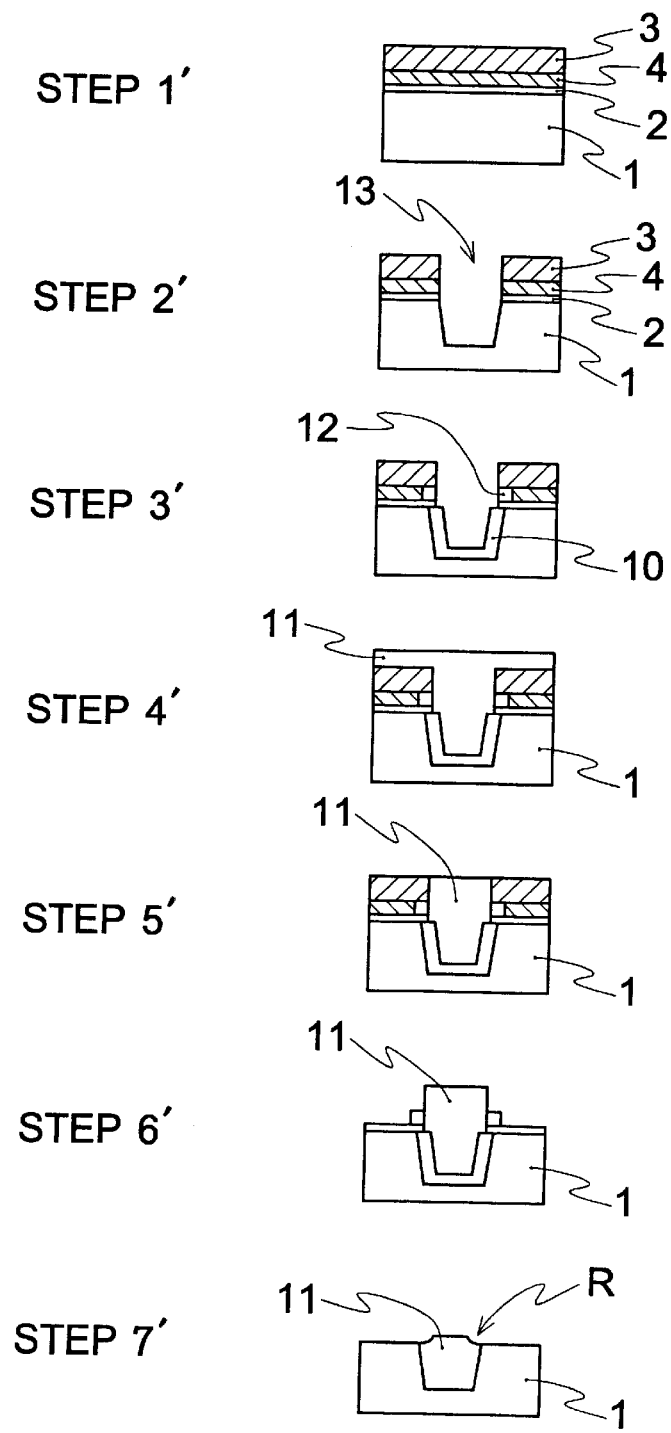
FIG. 10 is a cross-sectional view of manufacturing steps showing a method of manufacturing a conventional trench type element isolation structure.

Variations in STI level difference results from, of the element formation process shown in FIG. 9, variations in the thickness of a silicon nitride film 3 deposited at the process step 1, variations in the loss amount of the silicon nitride film 3 caused when a trench (groove) 13 is formed at the process step 2, variations in the height of a silicon oxide 11 deposited in the trench 13 at the process step 4, and variations in the loss amount of the silicon nitride film 3 and the silicon oxide 11 due to the leveling treatment at the process step 5. Therefore, in each process step, the thickness of the silicon nitride film 3 and the height of the silicon oxide 11 are measured, and the height of the silicon oxide 11 is amended based on the measured values so as to properly control the STI level difference when the element is completed. In the method of fabricating the trench type element isolation structure of the present embodiment, the height of the silicon oxide 11 is amended based on the measured values after the leveling treatment at the process step 5 so as to control the STI level difference at a proper size.

Figure 2:
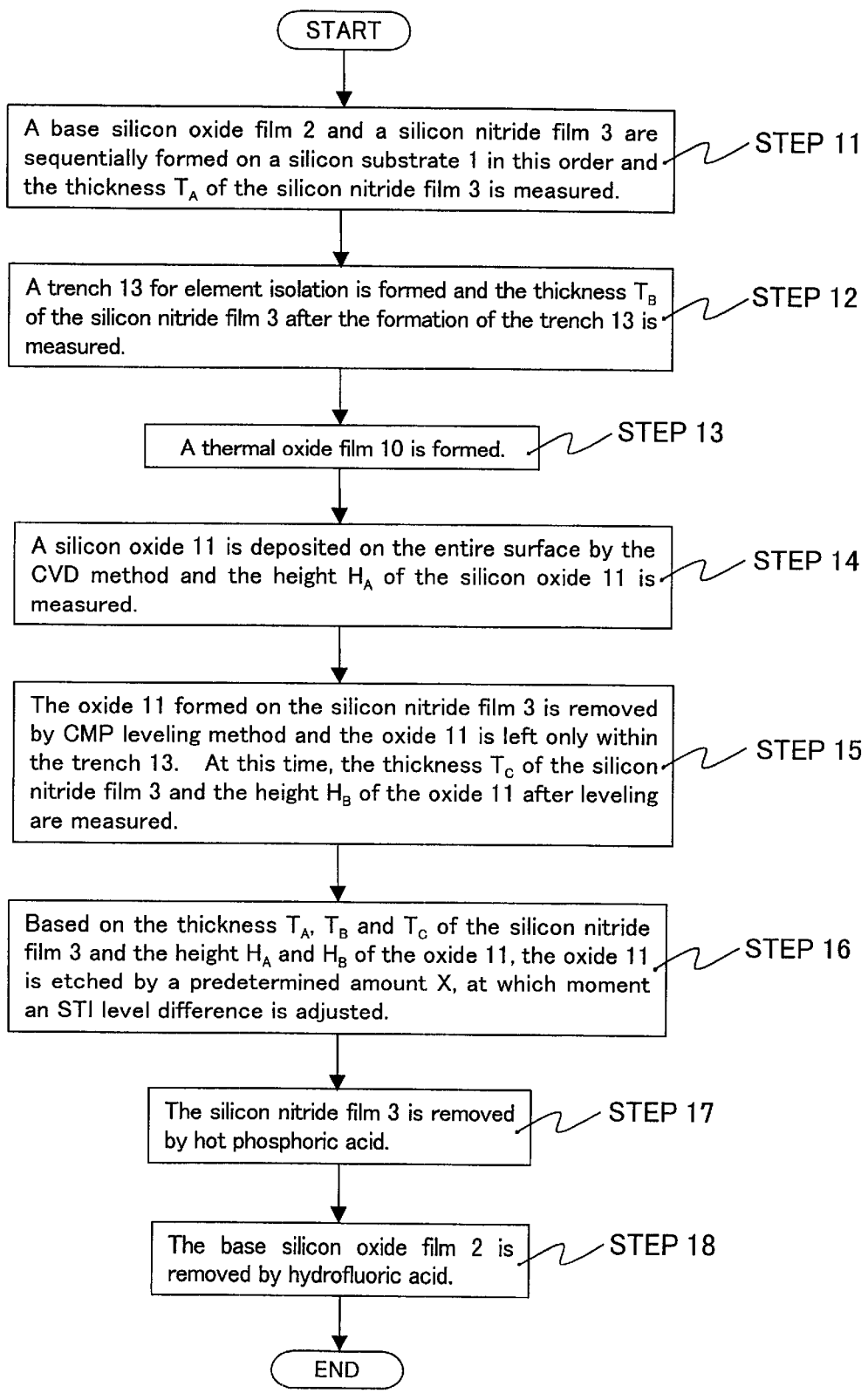
FIG. 2 is a flow chart of manufacturing steps showing a method of manufacturing a trench type element isolation structure of FIG. 1.

FIGS. 1 and 2 shows respectively a cross sectional views and a flowchart of the process steps showing the method of fabricating the trench type element isolation structure of the present embodiment. First, at the process step 11 an underlying oxide film 2 and a silicon nitride film 3 are accumulated in this order onto a silicon substrate 1, and the thickness $T_A$ of the silicon nitride film 3 is measured. At the process step 12 the trench 13 for element isolation is formed, and the thickness $T_B$ of the silicon nitride film 3 after the formation of the trench 13 is measured. At the process step 13 a thermal silicon oxide film 10 is formed on the inner wall of the trench 13 by thermal oxidation. At the process step 14 the silicon oxide 11 is deposited on the entire surface by the CVD method, and the height $H_A$ of the silicon oxide 11 is measured. At the process step 15 the silicon oxide 11 formed on the silicon nitride film 3 is removed by the CMP leveling method using the silicon nitride film 3 as a stopper, so as to leave the oxide 11 only inside the trench 13. After this leveling process, the thickness $T_C$ of the silicon nitride film 3 and the height $H_B$ of the silicon oxide 11 after the leveling treatment are measured. At the process step 16 a predetermined amount of the silicon oxide 11 is etched, based on the values of the different states of thickness $T_A$, $T_B$ and $T_C$ of the silicon nitride film 3 and the heights $T_A$ and $T_B$ of the silicon oxide 11, so as to adjust the STI level difference at this point. At the process step 17 after the silicon nitride film 3 is removed by a hot phosphoric acid, the underlying oxide film 2 is removed by fluoric acid. Consequently, a trench type element isolation structure with a controlled STI level difference is obtained.

The thickness $T_A$, $T_B$ and $T_C$ of the silicon nitride film 3 can be measured by using an optical method such as optical interference. The heights $H_A$ and $H_B$ of the silicon oxide 11 deposited in the trench 13 can also be measured by using an optical method such as optical interference. In that case, since the silicon oxide 11 and the thermal silicon oxide film 10 are made of the same material and the boundary between them can not be detected, the height $H_A$ and $H_B$ is detected as the height from the boundary between the thermal silicon oxide film 10 and the silicon substrate 1. This value may be used as the heights $H_A$ and $H_B$ in case of optical measurement.

The following is a description of a method of adjusting the STI level difference based on the different degrees of thickness $T_A$, $T_B$ and $T_C$ of the silicon nitride film 3 and the heights $H_A$ and $H_B$ of the silicon oxide 11. When variations in the thickness of the silicon nitride film 3 formed at the process step 11 are the main cause of variations in STI level difference, the value of the thickness $T_A$ of the silicon nitride film 3 is measured; when variations in the loss amount of the silicon nitride film 3 caused in the formation of the trench 13 at the process step 12 are the main cause, the value of the thickness $T_B$ of the silicon nitride film 3 is measured; and when variations in the height of the silicon oxide 11 deposited at the process step 14 are the main cause, the value of the height $H_A$ of the silicon oxide 11 is measured. The amount of the oxide 11 to be etched is adjusted in accordance with the sizes of these values $T_A$, $T_B$ and $H_A$. At the process step 15, when the variations in the loss amount of the silicon nitride film 3 caused by the leveling treatment is the main cause, the value of the thickness $T_C$ of the silicon nitride film 3 is used; and when the variations in the loss amount of the silicon oxide 11 caused in the same process is the main cause, the values of the heights $H_A$ and $H_B$ of the silicon oxide 11 are used to control the etching amount of the silicon oxide 11 in accordance with the loss amount due to the leveling treatment.

Table 1 shows an example of the amount of etching in the case where the height of the silicon oxide 11 is adjusted based on the thickness $T_C$ (the thickness of the silicon nitride film 3 after the leveling treatment) and the height $H_B$ (the height of the silicon oxide 11 after the leveling treatment). As shown in Table 1, the height of the silicon oxide 11 is adjusted by etching the oxide 11 in accordance with the thickness of the silicon nitride film 3 and the height of the silicon oxide 11, thereby controlling the STI level difference at an appropriate size.

TABLE 1

| Thickness of silicon nitride film 3 (C) (nm) | The etched amount of silicon oxide 11 (nm) | Time subjected to etching (sec) |
| --- | --- | --- |
| 63~70 | 0 | — |
| 70~77 | 10 | 1 |
| 77~84 | 20 | 25 |
| 84~91 | 30 | 49 |
| 91~98 | 40 | 73 |
| 98~105 | 50 | 97 |
| 105~112 | 60 | 121 |
| 112~120 | 70 | 145 |

| Height of silicon oxide 11 (B) (nm) | The etched amount of silicon oxide 11 (nm) | Time subjected to etching (sec) |
| --- | --- | --- |
| 385~395 | 0 | — |
| 395~405 | 10 | 1 |
| 405~415 | 20 | 25 |
| 415~425 | 30 | 49 |
| 425~435 | 40 | 73 |
| 435~445 | 50 | 97 |
| 445~455 | 60 | 121 |
| 455~465 | 70 | 145 |

Note
(*) Under the condition where concentration of hydrofluoric acid solution is 10%.

When the variations in the thickness of the silicon nitride film 3 formed at the process step 11; the variations in the loss amount of the silicon nitride film 3 caused in the formation of the trench 13 at the process step 12; and the variations in the amount of leveling treatment at the process step 15 are all involved to a similar degree in the variations in the STI level difference, the amount of leveling treatment obtained by (the thickness $T_B$ of the silicon nitride film 3)−{(the height $H_A$ of the silicon oxide 11)−(the height $H_B$ of the silicon oxide 11)} is used to adjust the etching amount of the silicon oxide 11 in accordance with the amount of the leveling treatment, thereby making the STI level difference uniform in size. Table 2 shows an example of the etching amount of the silicon oxide 11 with the amount of leveling treatment. As shown in Table 2, the STI level difference is adjusted by etching the silicon oxide 11 less when the amount of the leveling treatment is small and by etching the oxide 11 more when the amount of the leveling treatment is large.

TABLE 2

| The flatted amount (nm) | The etched amount of silicon oxide 11 (nm) | Time subjected to etching (sec) |
| --- | --- | --- |
| −15~−15 | 0 | — |
| −5~5 | 10 | 1 |
| 5~15 | 20 | 25 |
| 15~25 | 30 | 49 |
| 25~35 | 40 | 73 |
| 35~45 | 50 | 97 |
| 45~55 | 60 | 121 |
| 55~65 | 70 | 145 |

Note
(**) Under the condition where depth of the trench is 300 mm

When the variations in the thickness of the silicon nitride film 3 formed at the process step 11; the variations in the loss amount of the silicon nitride film 3 caused in the formation of the trench 13 at the process step 12; the variations in the thickness of the silicon oxide film 11 buried at the process step 14; and the variations in the amount of leveling treatment at the process step 15 are all involved to a similar degree in the variations in the STI level difference, the values of the thickness $T_A$ of the silicon nitride film 3 and the height $H_B$ of the silicon oxide 11 are used to control the etching amount of the silicon oxide 11 at the process step 16.

Embodiment 2

Figure 3:
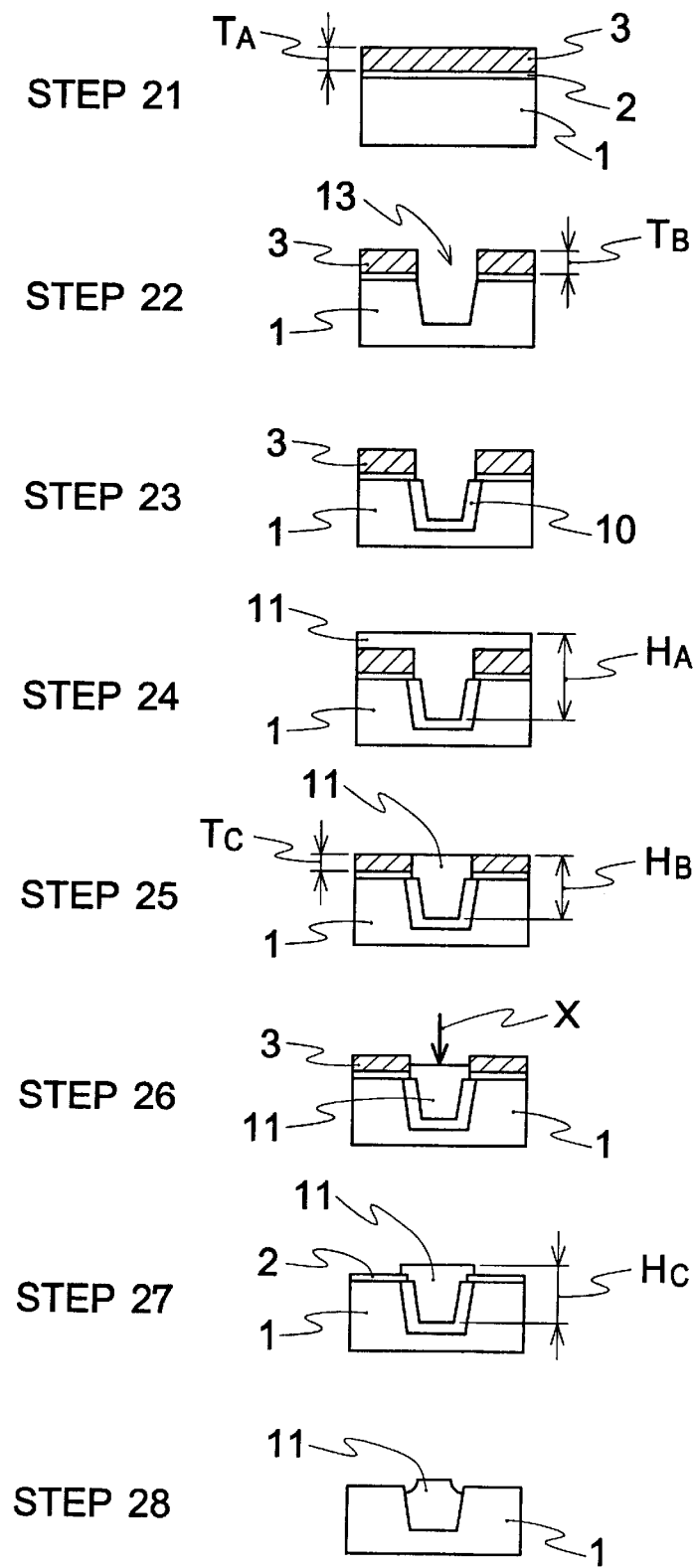
FIG. 3 is a cross-sectional view and a flow chart of manufacturing steps showing a method of manufacturing a trench type element isolation structure in Embodiment 2.
Figure 4:
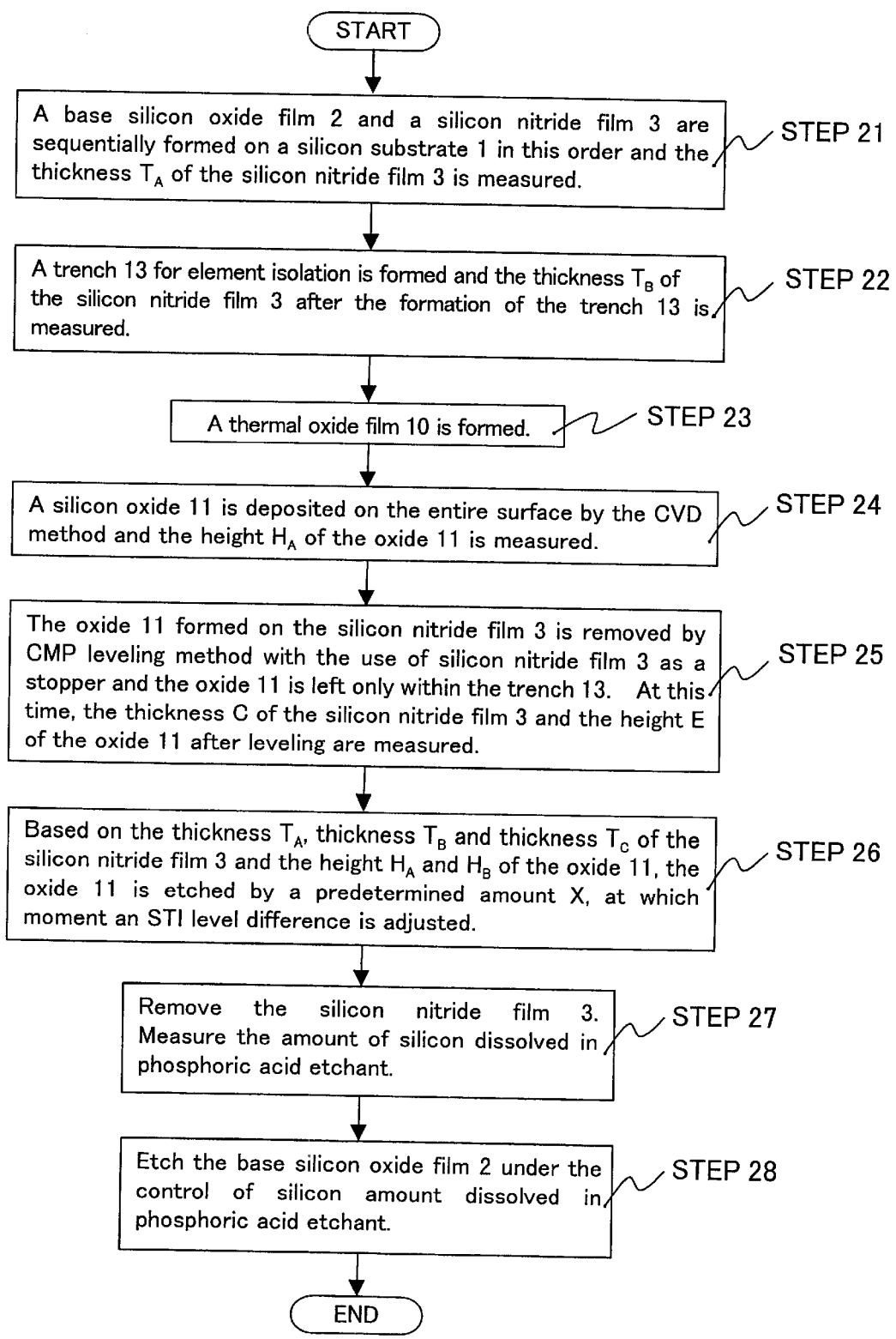
FIG. 4 is a flow chart of manufacturing steps showing a method of manufacturing a trench type element isolation structure of FIG. 3.

FIGS. 3 and 4 shows respectively a cross sectional views and a flowchart of the process steps showing the method of fabricating the trench type element isolation structure of the present embodiment. The process steps 21 to 26 are equal to the process steps 11 to 16 shown in FIG. 1 of the first embodiment. When the silicon nitride film 3 is removed by a hot phosphoric acid solution at the process step 27, the degree of newness of the hot phosphoric acid solution to be used (the number of wafers the hot phosphoric acid solution has processed so far) causes variations in the loss amount of the height of the silicon oxide 11. As a result, even if the etching amount of the silicon oxide 11 is adjusted based on the different degrees of thickness $T_A$, $T_B$ and $T_C$ and the heights $H_A$ and $H_B$ at the process step 26, the degree of newness of the heat phosphate solution causes variations in the height (height $H_C$) of the silicon oxide 11 after the removal of the silicon nitride film 3 at the process step 27. Therefore, in the present embodiment, when the silicon nitride film 3 is removed by fluoric acid at the process step 28 based on the degree of newness of the hot phosphoric acid solution, the etching amount of the silicon oxide 11 is controlled at the same time. This realizes a trench type element isolation structure whose STI level difference is properly controlled in size, without dropping from the substrate surface.

As an index to measure the degree of newness of the hot phosphoric acid solution, the amount of silicon dissolved in the solution can be used. When a small amount of silicon is dissolved in the heat phosphate solution, the underlying oxide film 2 is etched less than the standard, and when a large amount of silicon is dissolved, the film 2 is etched more than the standard at the process step 28 so as to control the amount of the oxide 11 to be etched as the same time. This realizes a trench type element isolation structure whose STI level difference is properly controlled in size, without dropping from the substrate surface. Table 3 shows an example of etching time in the case where the number of processing the silicon substrate is used as the index of the degree of newness of the heat phosphate solution to control the etching time at the process step 28, and also shows the amount of the silicon oxide 11 to be etched at the same time.

TABLE 3

| Number of sheet of silicon substrate | The etched amount of silicon oxide 11 (nm) | Time subjected to etching (sec) |
|---|---|---|
| 1~50 | 3 | 39 |
| 51~350 | 4 | 52 |
| 351~ | 7 | 91 |

Note
(***) Under the condition where diameter of silicon substrate is 80 in.

Embodiment 3

According to the present embodiment, the level difference between the underlying oxide film 2 and the oxide 11 formed by removing the silicon nitride film 3 is measured, and the amount of the oxide 11 to be etched together with the underlying oxide film 2 is adjusted based on the measured value.

Figure 5:
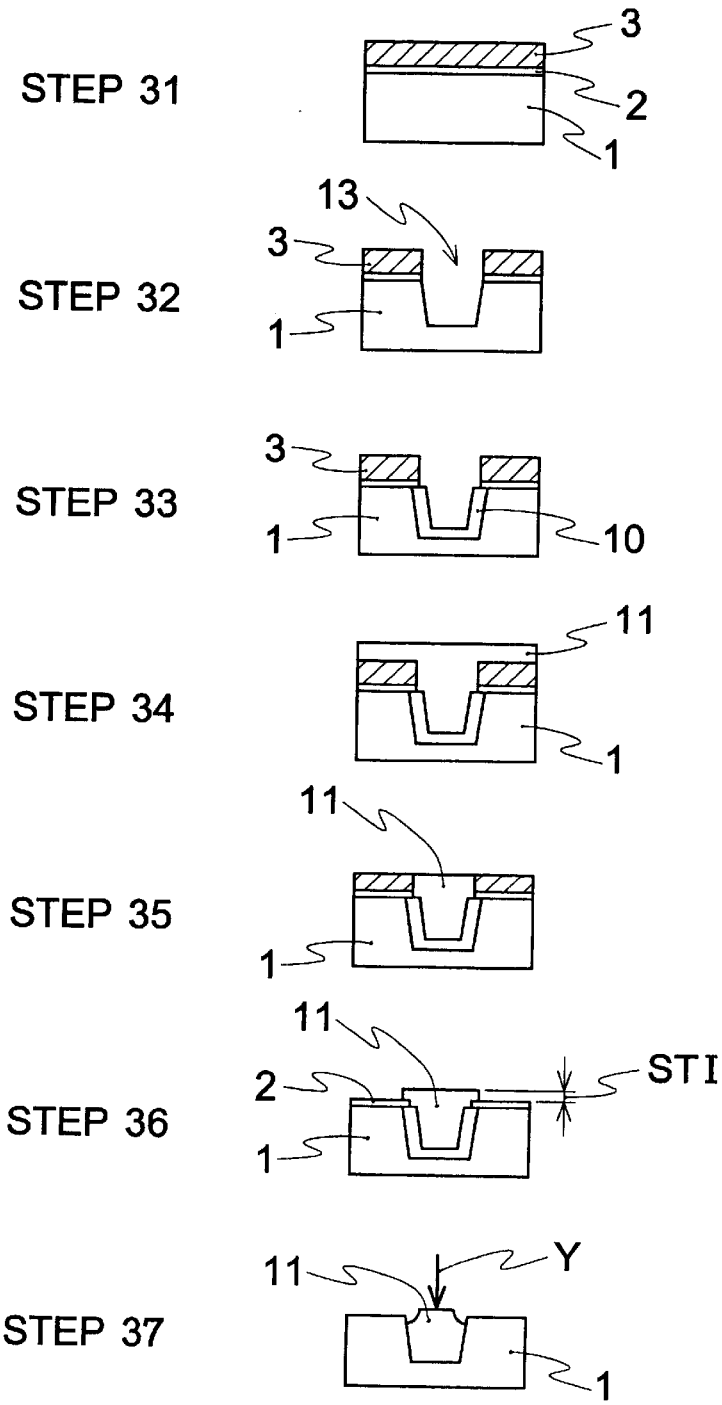
FIG. 5 is a cross-sectional view and a flow chart of manufacturing steps showing a method of manufacturing a trench type element isolation structure in Embodiment 3.
Figure 6:
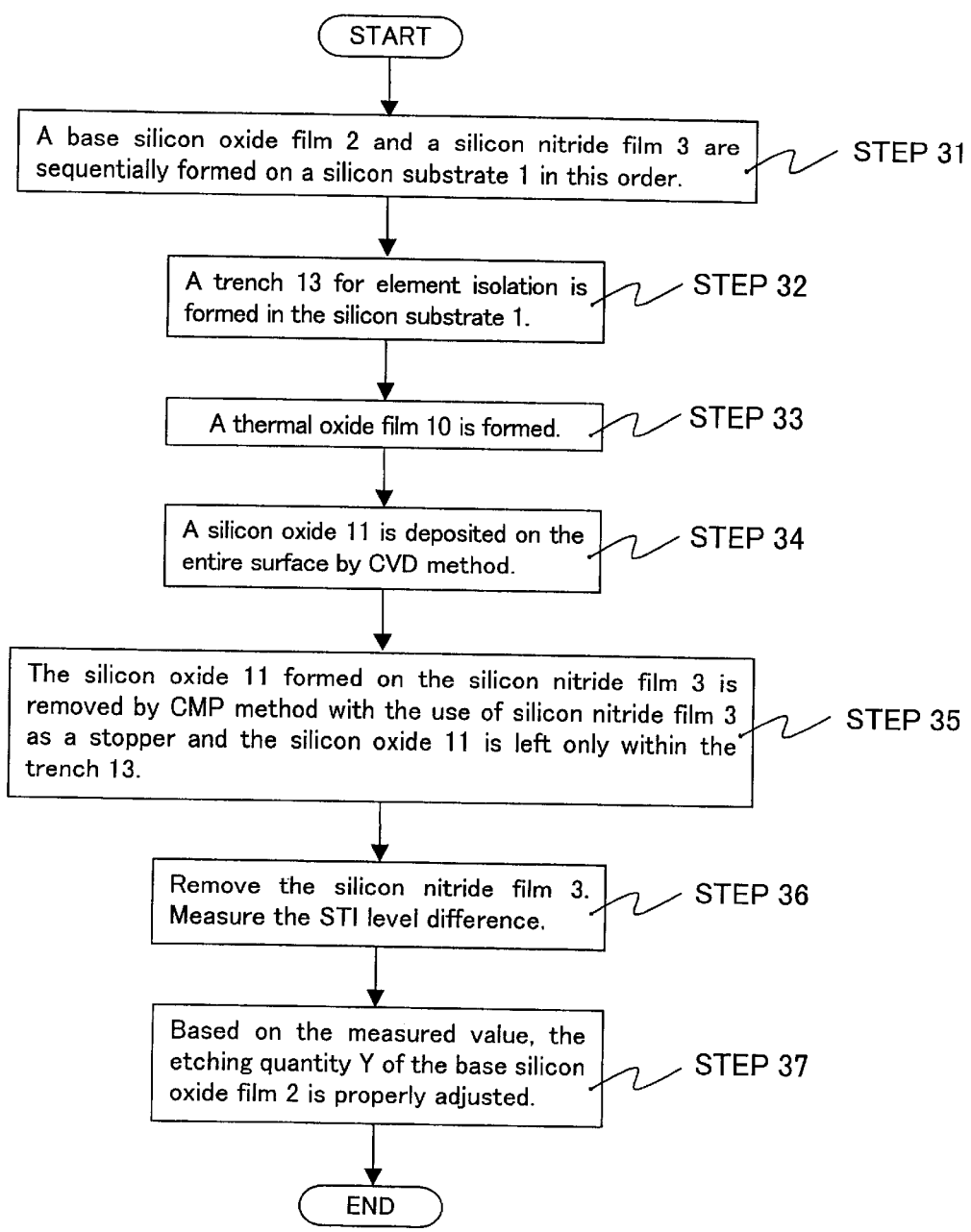
FIG. 6 is a flow chart of manufacturing steps showing a method of manufacturing a trench type element isolation structure of FIG. 5.

FIGS. 5 and 6 shows respectively a cross sectional views and a flowchart of the process steps showing the method of fabricating the trench type element isolation structure of the present embodiment. At the process step 31 an underlying oxide film 2 and a silicon nitride film 3 are accumulated in this order onto a silicon substrate 1. At the process step 32 a trench 13 for element isolation is formed in the silicon substrate 1. At the process step 33 a thermal oxide film 10 is formed on the inner wall of the trench 13 by thermal oxidation. At the process step 34 the oxide 11 is deposited on the entire surface by the CVD method. At the process step 35 the oxide 11 formed on the silicon nitride film 3 is removed by the CMP method using the silicon nitride film 3 as a stopper, so as to leave the oxide 11 only inside the trench 13. At the process step 36 the level difference STI formed when the silicon nitride film 3 is removed by the heat phosphate is measured. At the process step 37 the amount Y of the silicon oxide 11 to be etched at the same time as the removal of the underlying oxide film 2 using the fluoric acid is controlled based on the measured value STI. Consequently, a trench type element isolation structure whose level difference STI is properly controlled in size is realized.

Embodiment 4

Figure 7:
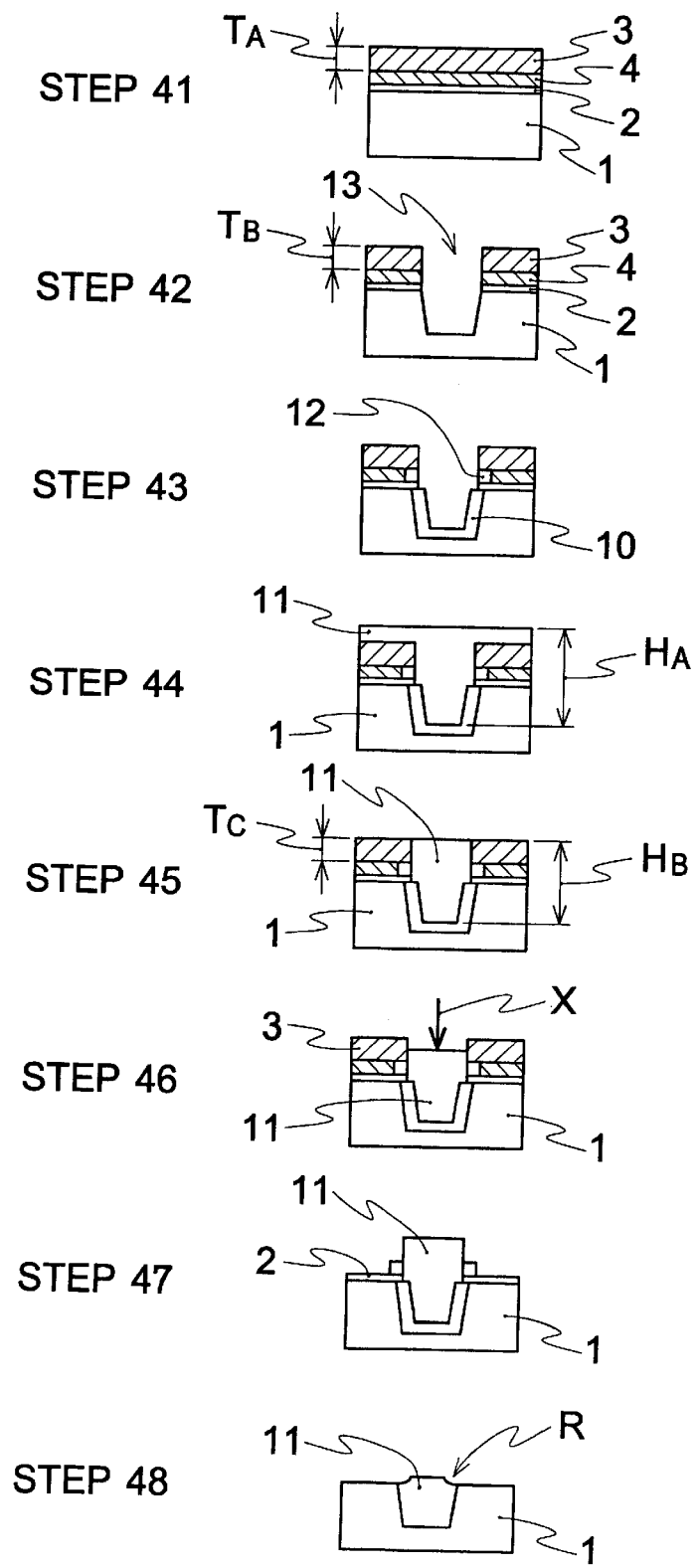
FIG. 7 is a cross-sectional view of manufacturing steps showing a method of manufacturing a trench type element isolation structure in Embodiment 4.
Figure 8:
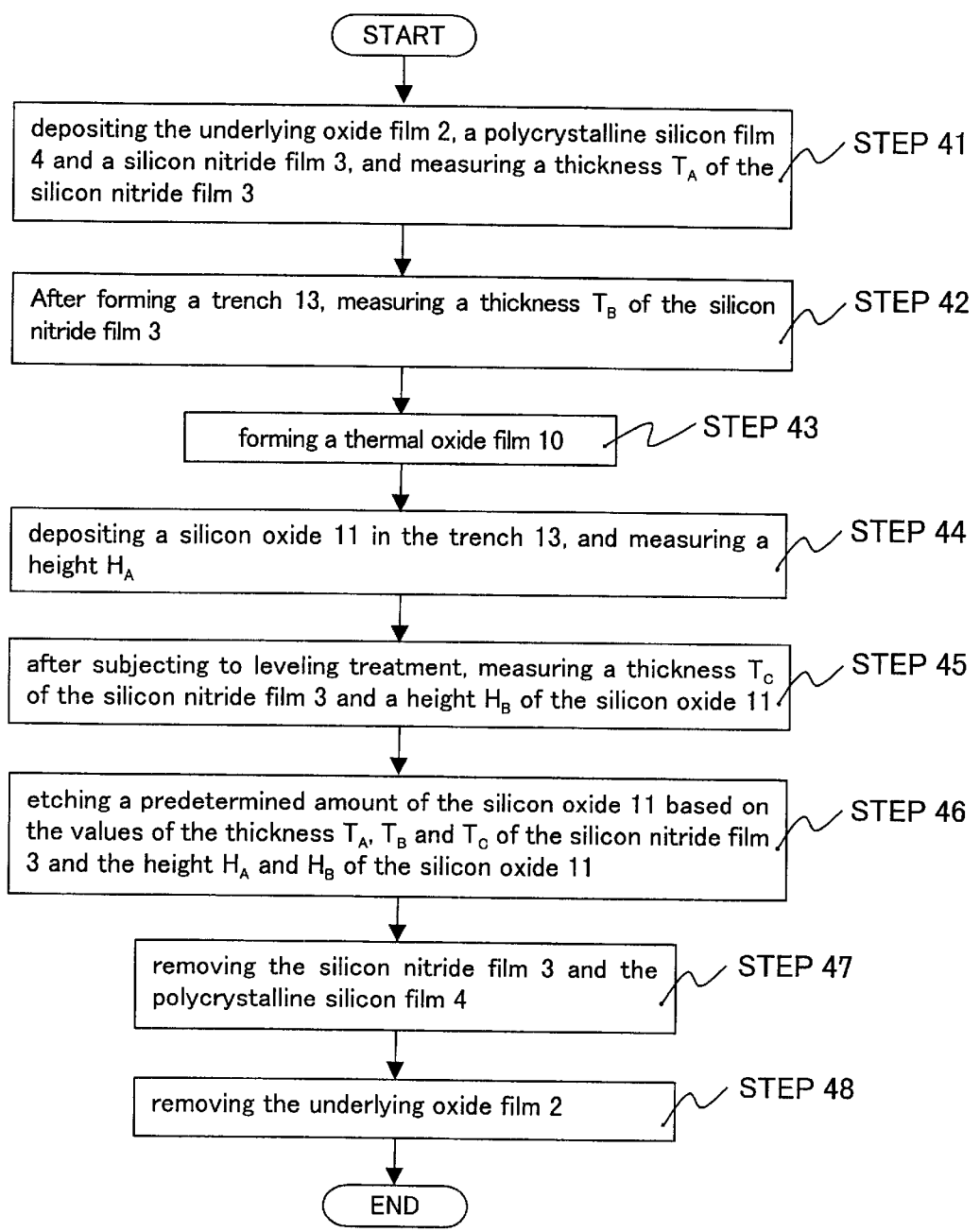
FIG. 8 is a flow chart of manufacturing steps showing a method of manufacturing a trench type element isolation structure of FIG. 7.
Figure 11A:
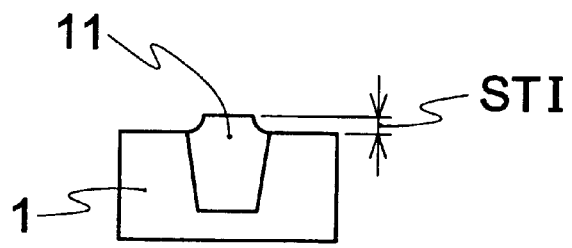
FIGS. 11(a) and 11(b) are each view for describing the disadvantages of a conventional method of manufacturing a trench type element isolation structure.
Figure 11B:
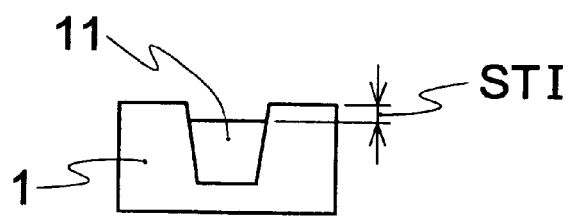
Figure 12:
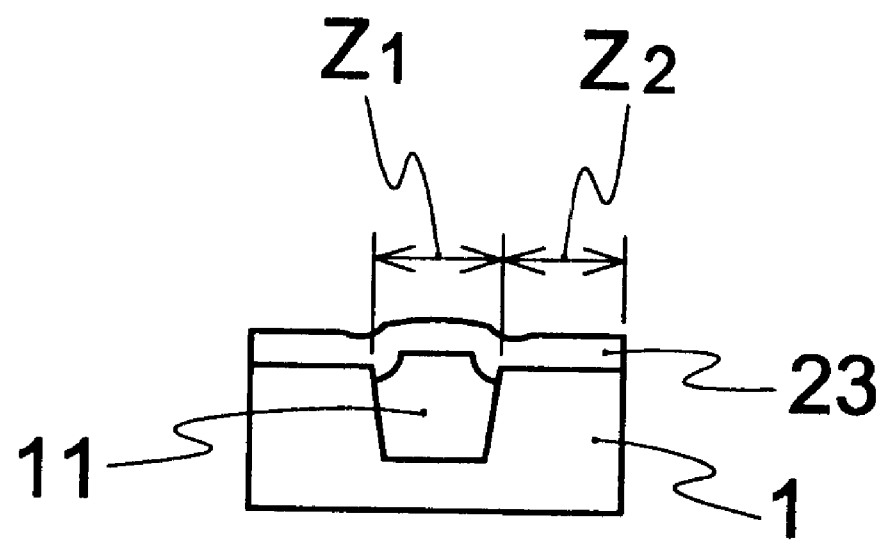
FIG. 12 is an explanatory view for illustrating a process of forming an electrode of an element using a trench type element isolation structure.

FIGS. 7 and 8 shows respectively a cross sectional views and a flowchart of the process steps showing the method of fabricating the trench type element isolation structure of the present embodiment. The present embodiment is an application of the first embodiment to the method of fabricating the conventional trench type element isolation structure shown in FIG. 11. In other words, in the process step 41 the formation of a polycrystalline silicon film 4 between an underlying oxide film 2 and a silicon nitride film 3 provides the method of fabricating the trench type element isolation structure of the first embodiment with the effect of expanding the formation region of a thermal oxide film 10 formed in the thermal oxidation treatment in the process step 43, and with the effect of restricting the development of hollows caused in the removal of the underlying oxide film 2 in the process step 48.

The method of fabricating the trench type element isolation structure of the present embodiment will be described as follows with reference to FIG. 7.

First, at the process step 41 the underlying oxide film 2, the polycrystalline silicon film 4 and the silicon nitride film 3 are deposited in this order onto the silicon substrate 1, and at the same time, the thickness $T_A$ of the silicon nitride film 3 is measured. At the process step 42 a trench 13 for element isolation is formed, and the thickness $T_B$ of the silicon nitride film 3 after the formation of the trench 13 is measured. At the process step 43 a thermal oxide film 10 is formed on the inner wall of the trench 13 by thermal oxidation. At the process step 44 a silicon oxide 11 is deposited on the entire surface by the CVD method, and then the height $H_A$ of the thermal silicon oxide 11 is measured. At the process step 45 the silicon oxide 11 formed on the silicon nitride film 3 is removed by the CMP method using the silicon nitride film 3 as a stopper, so as to leave the silicon oxide 11 only inside the trench 13. At this moment, the thickness $T_C$ of the silicon nitride film 3 and the height $H_B$ of the silicon oxide 11 after the leveling treatment are measured. At the process step 46 a predetermined amount of the silicon oxide 11 is etched based on the values of the different degrees of thickness $T_A$, $T_B$ and $T_C$ of the silicon nitride film 3 and the heights $H_A$ and $H_B$ of the silicon oxide 11, so as to adjust the level difference STI at this moment. At the process step 47 the silicon nitride film 3 is removed by hot phosphoric acid, and the polycrystalline silicon film 4 is removed by ammonia water. Later, the underlying oxide film 2 is removed with fluoric acid so as to obtain a trench type element isolation structure whose STI level difference is properly controlled. At this moment, the oxide film formed on the inner wall of the polycrystalline silicon can prevent the development of the hollows.

The etching amount of the silicon oxide 11 at the process step 46 is controlled in the same manner as in the first embodiment. To be more specific, when variations in the thickness of the silicon nitride film 3 formed at the process step 41 are the main cause of variations in level difference STI, the value of the thickness $T_A$ of the silicon nitride film 3 is measured; when variations in the loss amount of the silicon nitride film 3 caused in the formation of the trench 13 at the process step 42 are the main cause, the value of the thickness $T_B$ of the silicon nitride film 3 is measured; and when variations in the height of the silicon oxide 11 formed at the process step 44 are the main cause, the value of the height $H_A$ of the oxide is measured. The etching amount of the silicon oxide 11 is adjusted in accordance with the sizes of these values. At the process step 45 when the variations in the loss amount of the silicon nitride film 3 caused by the leveling treatment is the main cause, the value of the thickness $T_C$ of the silicon nitride film 3 is used; and when the variations in the loss amount of the silicon oxide 11 caused in the same process is the main cause, the values of the heights $H_A$ and $H_B$ of the silicon oxide 11 are used to control the etching amount of the silicon oxide 11 in accordance with the loss amount due to the leveling treatment.

Table 4 shows an example of the etching amount in the case where the height of the silicon oxide 11 is amended based on the thickness $T_C$ (the thickness of the silicon nitride film 3 after the leveling treatment) and the height $H_B$ (the height of the silicon oxide 11 after the leveling treatment). It must be noted that the polycrystalline silicon film 4 in this case has a thickness of 50 nm.

TABLE 4

| Thickness of silicon nitride film 3 (C) (nm) | The etched amount of silicon oxide 11 (nm) | Time subjected to etching (sec) |
|---|---|---|
| 13~20 | 0 | — |
| 20~27 | 10 | 1 |
| 27~34 | 20 | 25 |
| 34~41 | 30 | 49 |
| 41~48 | 40 | 73 |
| 48~55 | 50 | 97 |
| 55~62 | 60 | 121 |
| 62~70 | 70 | 145 |

| Height of oxide 11 (B) (nm) | The etched amount of silicon oxide 11 (nm) | Time subjected to etching (sec) |
|---|---|---|
| 385~395 | 0 | — |
| 395~405 | 10 | 1 |
| 405~415 | 20 | 25 |
| 415~425 | 30 | 49 |
| 425~435 | 40 | 73 |
| 435~445 | 50 | 97 |
| 445~455 | 60 | 121 |
| 455~465 | 70 | 145 |

Note
(****) Under the condition where concentration of hydrofluoric acid is 10%, the depth of the trench in the silicon substrate 1 is 300 nm, and the thickness of the polycrystalline silicon film 4 is 50 nm.

When the variations in the thickness of the silicon nitride film 3 formed at the process step 41; the variations in the loss amount of the silicon nitride film 2 caused in the formation of the trench 13 at the process step 42; and the variations in the amount of leveling treatment at the process step 45 are all involved to a similar degree in the variations in the level difference STI, the amount of leveling treatment obtained by (the thickness $T_B$ of the silicon nitride film 3)–{(the height $H_A$ of the silicon oxide 11)–(the height $H_B$ of the silicon oxide 11)} is used to control the etching amount of the silicon oxide 11 in the process step 46. Table 5 shows an example of the etching amount in the case where the height of the silicon oxide 11 is amended using the amount of the leveling treatment.

TABLE 5

| The flatted amount (nm) | The etched amount of oxide 11 (nm) | Time subjected to etching (sec) |
|---|---|---|
| −65~−55 | 0 | 0 |
| −55~−45 | 10 | 1 |
| −45~−35 | 20 | 25 |
| −35~−25 | 30 | 49 |
| −25~−15 | 40 | 73 |
| −15~−5 | 50 | 97 |
| −5~5 | 60 | 121 |
| 5~15 | 70 | 145 |

Note
(*****) Under the condition where concentration of hydrofluoric acid is 10%, the depth of the trench in the silicon substrate is 300 nm, and the thickness of the polycrystalline silicon film 4 is 50 nm.

The present embodiment can be applied to the second embodiment. To be more specific, in etching the silicon nitride film 3 at the process step 47 the amount of silicon dissolved in the etching solution can be measured in order to adjust the etching amount (etching time) of the underlying oxide film 2 based on the measured value at the process step 48.

The present embodiment can be also applied to the third embodiment. In that case, the level difference between the polycrystalline silicon film 4 and the silicon oxide 11 formed by removing the silicon nitride film 3 is measured, and the etching amount at the process step 48 is controlled based on the measured value. Moreover, the level difference between the silicon oxide 11 and the underlying oxide film 2 formed by removing the polycrystalline silicon film 4 is measured, so as to control the etching amount based on the measured value.

According to the method of manufacturing a first aspect of the trench type semiconductor element isolation structure, height of the oxide is corrected on the basis of at least one measured value of the first, second and third thickness of the silicon nitride film and the first and second height of the silicon oxide. The height of the oxide measured from the surface of the silicon substrate can be controlled to be a suitable value.

According to the method of manufacturing a second aspect of the trench type semiconductor element isolation structure, the silicon oxide as well as the oxide are etched by the predetermined amount according to the amount of silicon dissolved in etchant of the silicon nitride film. The height of the silicon oxide measured from the surface of the silicon substrate can be controlled to be a suitable value, and the height is not influenced by the degree of new or old of the etchant.

According to the method of manufacturing a third aspect of the trench type semiconductor element isolation structure, the silicon oxide film and the oxide are etched by the predetermined amount according to the measured value of the level difference between the silicon oxide film and the oxide formed in the sixth step. Accordingly, the height of the silicon oxide from the surface of the silicon substrate can be controlled to be a suitable value without being influenced by the degree of new or old of the etchant.

According to the method of manufacturing a fourth aspect of the trench type semiconductor element isolation structure, the height of the silicon oxide is corrected on the basis of the measured value of at last one of each thickness of the first, second and third silicon nitride films and each of the first silicon oxide and second silicon oxide. Accordingly, the height of the silicon oxide from the surface of the silicon substrate can be controlled to be a suitable value and the recess which is generated in the periphery of the silicon oxide can be prevented from being generated.

According to the method of manufacturing a fifth aspect of the trench type semiconductor element isolation structure, the silicon oxide film and the oxide are etched by the predetermined amount of the silicon oxide on the basis of the amount of silicon dissolved in the etchant of the silicon nitride film. Accordingly, the height of the silicon oxide from the surface of the silicon substrate can be controlled to be a suitable value without being influenced by the degree of new or old of the etchant.

According to the method of manufacturing a fifth aspect of the trench type semiconductor element isolation structure, the silicon oxide film and the silicon oxide are etched by the predetermined amount of the silicon oxide film and the oxide on the basis of the measured value of the level difference between the silicon oxide film and the oxide formed in the sixth step. Accordingly, the height of the silicon oxide from the surface of the silicon substrate can be controlled to be a suitable value and the recess which is generated in the periphery of the oxide can be prevented from being generated without being influenced by the degree of new or old of the etchant.

The forgoing is considered as illustrative only of the principles of the invention. Further, because numerous modification and changes will readily occur to those skilled in the art, it is not desired to limit the invention to the exact construction and operation shown and described, and accordingly all suitable modifications and equivalents may be resorted to falling within the scope of the invention as definition by the claims which follow.

What is claimed is:

1. A method of manufacturing a trench type semiconductor element isolation structure comprising steps of:
   (i) forming a silicon oxide film on a silicon substrate and forming a silicon nitride film on the silicon oxide film;
   (ii) forming a trench penetrating the silicon nitride film and the silicon oxide film, said trench reaching an interior of the silicon substrate;
   (iii) forming a thermal silicon oxide film on an inner wall of said trench;
   (iv) depositing a silicon oxide in said trench;
   (v) subjecting said silicon oxide to a polishing treatment with the silicon nitride film used as a stopper layer leaving said silicon oxide only in the trench;
   (vi) etching the silicon oxide by an amount according to at least one of the thickness of the silicon nitride film after the steps (i), (ii) and (v) and heights of the silicon oxide after the steps (iv) and (v);
   (vii) etching the silicon nitride film after completing the step (vi); and
   (viii) etching the silicon oxide film after completing the step (vii).

2. The method of claim 1, wherein the silicon oxide is etched by in the step (vi) the amount according to a value based on a sum of a thickness of the silicon nitride film after the step (ii) and a height of the silicon oxide after the step (v) subtracted by a height of the silicon oxide after the step (iv).

3. The method of claim 1, wherein the silicon oxide is etched in the step (vi) by the amount on the basis of a thickness of the silicon nitride film after the step (ii) and a second height of the silicon oxide after the step (v).

4. A method of manufacturing a trench type semiconductor element isolation structure comprising steps of:
   (i) forming a silicon oxide film on a silicon substrate and forming a silicon nitride film on the silicon oxide film;
   (ii) forming a trench penetrating the silicon nitride film and the silicon oxide film, said trench reaching an interior of the silicon substrate;
   (iii) forming a thermal silicon oxide film on an inner wall of said trench;
   (iv) depositing a silicon oxide in said trench;
   (v) subjecting said silicon oxide to a polishing treatment with the silicon nitride film used as a stopper layer leaving said silicon oxide only in the trench;
   (vi) etching said silicon oxide by an amount after completing the step (v);
   (vii) etching said silicon nitride film after completing the step (vi); and
   (viii) etching said silicon oxide film and said silicon oxide based on an amount of dissolved silicon in an etchant in the step (vii).

5. A method of manufacturing a trench type semiconductor element isolation structure comprising steps of:
   (i) forming a silicon oxide film on a silicon substrate and forming a silicon nitride film on the silicon oxide film;
   (ii) forming a trench penetrating the silicon nitride film and the silicon oxide film, said trench reaching an interior of the silicon substrate;
   (iii) forming a thermal silicon oxide film on an inner wall of said trench;
   (iv) depositing a silicon oxide in said trench;
   (v) subjecting said silicon oxide to a polishing treatment with the silicon nitride film used as a stopper layer leaving said silicon oxide only in the trench;
   (vi) etching said silicon nitride film after completing the step (v);
   (vii) measuring a difference in surface level between said silicon oxide film and said silicon oxide; and
   (viii) etching said silicon oxide film and said silicon oxide by an amount based on the measured value of the difference in surface level between said silicon oxide film and said silicon oxide.

* * * * *